US011277896B2

(12) United States Patent
Mohan

(10) Patent No.: US 11,277,896 B2
(45) Date of Patent: Mar. 15, 2022

(54) ACTIVE GAIN CONTROL FOR POWER FACTOR CORRECTION

(71) Applicant: ERP POWER, LLC, Moorpark, CA (US)

(72) Inventor: James H. Mohan, Valencia, CA (US)

(73) Assignee: ERP POWER, LLC, Moorpark, CA (US)

( * ) Notice: Subject to any disclaimer, the term of this patent is extended or adjusted under 35 U.S.C. 154(b) by 24 days.

(21) Appl. No.: 16/912,583

(22) Filed: Jun. 25, 2020

(65) Prior Publication Data

US 2020/0413513 A1 Dec. 31, 2020

Related U.S. Application Data

(60) Provisional application No. 62/866,363, filed on Jun. 25, 2019.

(51) Int. Cl.
| | |
|---|---|
| *H05B 45/355* | (2020.01) |
| *H02M 1/42* | (2007.01) |
| *H03G 3/30* | (2006.01) |
| *H03F 3/45* | (2006.01) |
| *H02M 7/06* | (2006.01) |

(52) U.S. Cl.
CPC ........ *H05B 45/355* (2020.01); *H02M 1/4208* (2013.01); *H02M 7/06* (2013.01); *H03F 3/45475* (2013.01); *H03G 3/30* (2013.01)

(58) Field of Classification Search
None
See application file for complete search history.

(56) References Cited

U.S. PATENT DOCUMENTS

| | | | | |
|---|---|---|---|---|
| 7,248,025 | B2* | 7/2007 | Adachi | G05F 1/575 323/273 |
| 9,730,289 | B1* | 8/2017 | Hu | H05B 45/395 |
| 10,185,339 | B2* | 1/2019 | Fazeel | G05F 1/575 |
| 2005/0184711 | A1* | 8/2005 | Chen | G05F 1/575 323/280 |
| 2010/0202169 | A1* | 8/2010 | Gaboury | H02M 1/4225 363/49 |
| 2011/0101936 | A1* | 5/2011 | Wang | G05F 1/56 323/280 |

(Continued)

OTHER PUBLICATIONS

Power Factor Correction (PFC) Handbook, Choosing the Right Power Factor Controller Solution, On Semiconductor, Rev. 5, Apr. 2014, 130 pages.

(Continued)

*Primary Examiner* — Amy Cohen Johnson
*Assistant Examiner* — James H Cho
(74) *Attorney, Agent, or Firm* — Lewis Roca Rothgerber Christie LLP

(57) ABSTRACT

An active gain control circuit includes a voltage divider having a variable resistance configured to attenuate a rectified input line voltage to produce a reference signal, a filter circuit configured to extract a DC-level reference voltage from the reference signal, and an operational amplifier configured to receive the DC-level reference voltage and a comparison voltage, and to generate a gate control signal based on a difference between the comparison voltage and the DC-level reference voltage, wherein a resistance of the voltage divider is controlled by the gate control signal.

19 Claims, 3 Drawing Sheets

(56) References Cited

U.S. PATENT DOCUMENTS

2016/0033984 A1* 2/2016 Lee .................... G05F 1/575
 323/280

OTHER PUBLICATIONS

MPS Boundary Mode PFC Controller, MP44010, The Future of Analog IC Technology, Rev. 1.2, Mar. 18, 2015, 14 pages.
Adragna, C., AN966 Application Note, L6561, Enhanced Transition Mode Power Factor Corrector, Mar. 2003, 21 pages.

* cited by examiner

ACTIVE GAIN CONTROL FOR POWER FACTOR CORRECTION

CROSS-REFERENCE TO RELATED APPLICATION(S)

This application claims priority to, and the benefit of, U.S. Provisional Application No. 62/866,363 ("ACTIVE GAIN CONTROL FOR LINEAR MULTIPLIER OPERATION"), filed on Jun. 25, 2019, the entire content of which is incorporated herein by reference.

FIELD

Aspects of the present disclosure are related to a system for gain control in an LED driver and a method for using the same.

BACKGROUND

In current LED lighting applications, LED drivers are generally required to provide a PFC (power factor correction) function, that is, to make an input current in phase with a full-wave-rectified line input voltage. The PFC circuits are often designed for a particular line input voltage range. Some universal input voltage LED drivers use a circuit that selects between two reference signal gain levels for low-line and high-line input voltage operation. However, it may be difficult to meet industry standard requirements for total harmonic distortion (THD) and power factor (PF) across all input voltages.

The above information disclosed in this Background section is only for enhancement of understanding of the disclosure, and therefore it may contain information that does not form the prior art that is already known to a person of ordinary skill in the art.

SUMMARY

Aspects of embodiments of the present disclosure are directed to an active gain control circuit coupled to a power factor correction (PFC) controller for use in lighting drivers (e.g., LED drivers). In some embodiments, the active gain control circuit provides continuous (e.g., infinite) variability of reference signal gain level, rather than a few limited discrete gain levels provided by the related art. Further, the closed loop control of the reference gain level, aids in substantially reducing or minimizing unit sample to sample performance variation.

According to some embodiments of the present disclosure, there is provided an active gain control circuit including: a voltage divider having a variable resistance configured to attenuate a rectified input line voltage to produce a reference signal; a filter circuit configured to extract a DC-level reference voltage from the reference signal; and an operational amplifier configured to receive the DC-level reference voltage and a comparison voltage, and to generate a gate control signal based on a difference between the comparison voltage and the DC-level reference voltage, wherein a resistance of the voltage divider is controlled by the gate control signal.

In some embodiments, the voltage divider includes: a first resistor configured to receive the rectified input line voltage; and a voltage-controlled resistor (VCR) electrically coupled to the first resistor and the operational amplifier, a resistance of the VCR being determined by the gate control signal.

In some embodiments, the first resistor has a resistance of 800 kΩ to 1.2 MΩ, and the resistance of the VCR varies from 500 to 10 kΩ depending on the gate control signal.

In some embodiments, the first resistor is electrically coupled between a positive output terminal of a rectifier and a reference input, and wherein the VCR is electrically coupled between the reference input and a negative output terminal of the rectifier.

In some embodiments, the operational amplifier is configured to adjust the resistance of the VCR to regulate a reference voltage of the reference input to the comparison voltage.

In some embodiments, the VCR includes: a junction field effect transistor (JFET) having a gate electrically coupled to an output of the operational amplifier.

In some embodiments, the operational amplifier is configured to maintain the JFET in an ohmic region of operation irrespective of the rectified input line voltage In some embodiments, the resistance of the VCR is configured to increase as a voltage of the gate control signal increases, and to decrease as the voltage of the gate control signal decreases.

In some embodiments, the active gain control circuit further includes: a comparison voltage generator electrically coupled to a first input terminal of the operational amplifier and configured to generate the comparison voltage.

In some embodiments, the comparison voltage generator includes a zener diode, and the comparison voltage is 0.5 V to 6 V.

In some embodiments, the filter circuit includes a second resistor electrically coupled between a reference input and a second input terminal of the operational amplifier; and a first capacitor electrically coupled between the second input terminal and a second output terminal of a rectifier.

In some embodiments, the second resistor has a resistance of 400 kΩ to 600 kΩ, and the first capacitor has a capacitance value of 1 µF to 22 µF.

In some embodiments, the active gain control circuit further includes: a feedback impedance electrically coupled between an output and a second input terminal of the operational amplifier, and configured to control a gain of the operational amplifier.

In some embodiments, the feedback impedance includes: a third resistor; and a second capacitor coupled in series with the third resistor.

In some embodiments, the third resistor has a resistance of 500Ω to 500 kΩ, and the second capacitor has a capacitance value of 1 nF to 1 pF.

According to some embodiments of the present disclosure, there is provided a power supply system including: a power factor correction (PFC) controller configured to reduce a total harmonic distortion and increase a power factor of the power supply system, the PFC controller having a reference input; and an active gain control circuit configured to regulate a voltage at the reference input, and including: a voltage divider having a variable resistance configured to attenuate a rectified input line voltage to produce a reference signal; a filter circuit configured to extract a DC-level reference voltage from the reference signal; and an operational amplifier configured to receive the DC-level reference voltage and a comparison voltage, and to generate a gate control signal based on a difference between the comparison voltage and the DC-level reference voltage, wherein a resistance of the voltage divider is controlled by the gate control signal.

In some embodiments, the power supply system further includes: a rectifier configured to rectify an input line voltage to generate the rectified input line voltage; and a converter configured to convert the rectified input line voltage into a drive signal for powering a light source.

In some embodiments, the PFC controller is configured to determine a shape of an input current waveform of the converter based on the voltage at the reference input.

In some embodiments, the input line voltage is from 100 Vac to 277 Vac.

In some embodiments, the voltage divider includes a voltage-controlled resistor (VCR) configured to receive the gate control signal, and the operational amplifier is configured to regulate the voltage at the reference input by increasing a resistance of the VCR in response to the voltage at the reference input being less than the comparison voltage, and decreasing the resistance of the VCR in response to the voltage at the reference input being greater than the comparison voltage.

BRIEF DESCRIPTION OF THE DRAWINGS

The accompanying drawings, together with the specification, illustrate example embodiments of the present disclosure, and, together with the description, serve to explain the principles of the present disclosure.

DETAILED DESCRIPTION

The detailed description set forth below is intended as a description of example embodiments of a system and method for signal gain control in lighting drivers (e.g., LED drivers), provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the spirit and scope of the disclosure. As denoted elsewhere herein, like element numbers are intended to indicate like elements or features.

Figure 1:
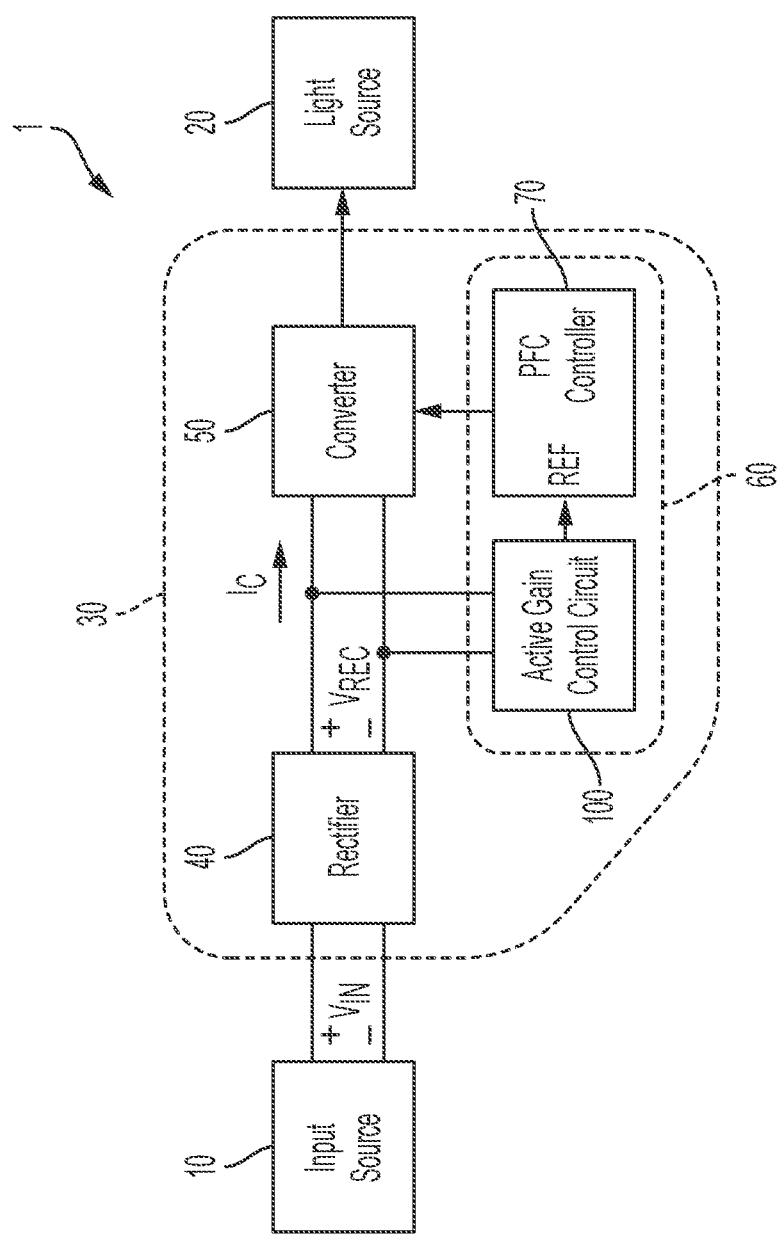
FIG. 1 illustrates a lighting system including an active gain control circuit coupled to a power-factor-correction controller, according to some example embodiments of the present disclosure.

FIG. 1 illustrates a lighting system 1 including an active gain control circuit 100 coupled to a PFC controller 70, according to some example embodiments of the present disclosure.

According to some embodiments, the lighting system 1 includes an input source 10, a light source 20, and a power supply system 30 (e.g., a switched-mode power supply) for powering and controlling the brightness of the light source 20 based on the signal from the input source 10.

The input source 10 may include an alternating current (AC) power source that may operate at a 100 Vac (e.g., in Japan), 120 Vac (e.g., in the US), a 240 Vac (e.g., in Europe), or 277 Vac (e.g., in large industrial plants). The input source 10 may also include a dimmer electrically powered by said AC power sources. The dimmer may modify (e.g., cut/chop a portion of) the input AC signal according to a dimmer level before sending it to the power supply system 30, and thus variably reduces the electrical power delivered to the power supply system 30 and the light source 20. In some examples, the dimmer may be a TRIAC or ELV dimmer, and may chop the front end or leading edge of the AC input signal. According to some examples, the dimmer interface may be a rocker interface, a tap interface, a slide interface, a rotary interface, or the like. A user may adjust the dimmer level by, for example, adjusting a position of a dimmer lever or a rotation of a rotary dimmer knob, or the like. The light source 20 may include one or more light-emitting-diodes (LEDs) or an arc or gas discharge lamp with electronic ballasts, such as high intensity discharge (HID) or fluorescent lights.

In some embodiments, the power supply system 30 includes a rectifier 40, a converter 50, and a power factor correction (PFC) circuit 60. The rectifier 40 provides a same polarity of output for either polarity of the AC signal from the input source 10. In some examples, the rectifier 40 may be a full-wave circuit using a center-tapped transformer, a full-wave bridge circuit with four diodes, a half-wave bridge circuit, or a multi-phase rectifier.

The converter 50 converts the rectified AC signal generated by the rectifier 40 into a drive signal for powering and controlling the brightness of the light source 20. The drive signal may depend on the type of the one or more LEDs of the light source 20. For example, when the one or more LEDs of the light source 20 are constant current LEDs the drive signal may be a variable voltage signal, and when the light source 20 requires constant voltage, the drive signal may be a variable current signal. In some embodiments, the converter 50 includes a boost converter for maintaining (or attempting to maintain) a constant DC bus voltage on its output while drawing a current that is in phase with and at the same frequency as the line voltage (by virtue of the PFC circuit 60). Another switched-mode converter (e.g., a transformer) inside the converter 50 produces the desired output voltage from the DC bus.

PFC circuit 60 improves (e.g., increases) the power factor of the load on the input source 10 and reduces the total harmonic distortions (THD) of the power supply system 30. As non-linear loads including the rectifier 40 and the converter 50 distort the current drawn from the input source 10, the PFC circuit 60 counteracts the distortion and raises the power factor. In some examples, other sources of current distortion may be input filter capacitors, input filter chokes, boost inductor, second stage transformer, and any non-linear elements or loads on the secondary side of a transformer inside the converter 50, which would be reflected over to the primary side of the transformer. Further, the main switch (e.g., transistor) in the PFC/boost stage of the converter 50 may also distort the current if it is fed with a constant duty cycle or constant on time. The PFC circuit 60 is capable of counteracting current distortions regardless of the source.

According to some embodiments, the PFC circuit 60 includes a PFC controller (e.g., the current-mode PFC controller) 70 and an active gain control circuit 100. The PFC controller 70 controls the converter 50 to ensure that the input current $I_C$ to the converter 50 matches the waveform of the input voltage $V_{REC}$ generated by the rectifier 40. In so doing, the PFC controller 70 senses a current $I_C$ flowing through an inductor of the converter 50 (e.g., the inductor of the boost circuit), and compares this sensed current against the rectified input voltage $V_{REC}$. Based on this comparison, the PFC controller 70 generates a control signal that controls the on-off timing of a switching element in the converter 50

(e.g., the inductor of the boost circuit), which determines the shape of the input current waveform at the converter 50.

According to some embodiments, the active gain control circuit 100 allows the PFC controller 70 to monitor the waveform of the rectified input voltage through a reference input (e.g., a PFC reference input) REF. In some examples, the input line voltage $V_{IN}$ may vary over a wide range (e.g., from 100 Vac to 277 Vac). However, this voltage range is too high for the PFC controller 70 to sense directly. The PFC controller 70 may have a linear mode of operation, which the PFC controller 70 should stay within for good performance, with a fairly narrow window of acceptable reference signal level voltages (e.g., voltages within 30% of a nominal value). Thus, in some embodiments, the active gain control circuit 100 actively attenuates the rectified input voltage $V_{REC}$ to bring it down to safe levels for the PFC controller 70 to sense through the reference input REF. Further, the active gain control circuit 100 preserves the shape of the rectified input voltage $V_{REC}$ when attenuating to maintain proper power-factor correction, and low total harmonic distortion (THD) of the input line current $I_C$.

Some universal input voltage LED Drivers in the related art use a circuit that selects between two reference signal gain levels for low-line (e.g., 120 Vac) and high-line (e.g., 230/277 Vac) input voltage operation. In the related art, a comparator may select which gain level (resistor value of a voltage divider) to use, based on the level of the input voltage. However, with universal input drivers, it may be difficult to meet industry standard requirements for total harmonic distortion (THD) and power factor (PF) (e.g., THD<20% and PF>0.9) across all input voltages. This may stem from only having two discrete gain levels for the reference input REF on the PFC controller chips. One gain level may cover 108-132 Vac, the other gain level may cover 198 Vac-305 Vac. Thus, a driver may perform well at one input line voltage but may perform poorly at another line input voltage. In contrast, the active gain control circuit 100, according to some embodiments, provides continuous (e.g., infinite) variability in gain levels, to match (e.g., exactly match) the required gain for the operating input line voltage $V_{IN}$.

Figure 2:
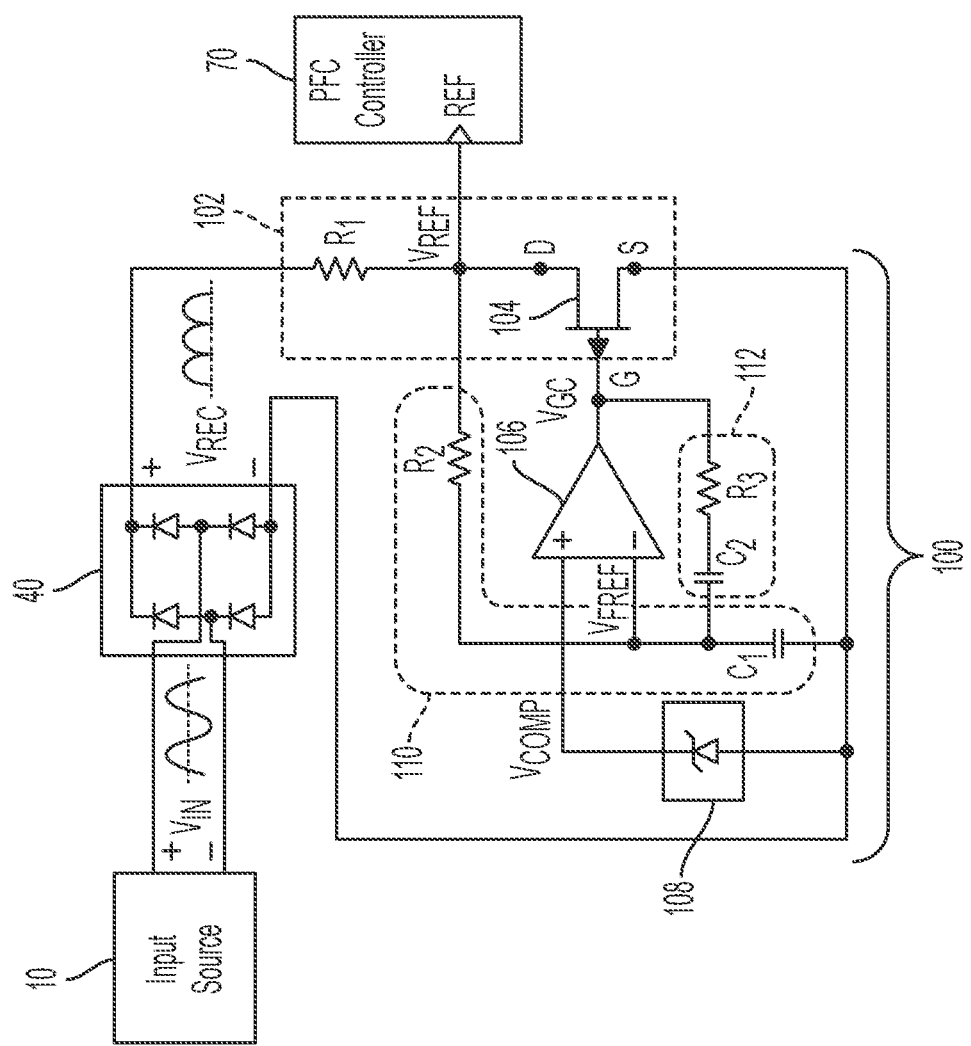
FIG. 2 is a schematic diagram of the active gain control circuit, according to some embodiments of the present disclosure.

FIG. 2 is a schematic diagram of the active gain control circuit 100, according to some embodiments of the present disclosure.

According to some embodiments, the active gain control circuit 100 includes a dynamic voltage divider 102 configured to produce a voltage $V_{REF}$ at the reference input REF of the PFC controller 70 based on the rectified input voltage $V_{REC}$. The voltage divider 102 includes a first resistor (a discrete pull-down resistor) $R_1$ and a voltage-controlled resistor (VCR) 104. The first resistor is electrically coupled between a positive output terminal of the rectifier 40 and the reference input of the PFC controller 70, and the VCR 104 is electrically coupled between the negative output terminal of the rectifier 40 (which acts as the local ground) and the reference input of the PFC controller 70. The VCR 104 has a variable resistance that is determined based on a gate control signal $V_{GC}$. In some examples, the VCR 104 may have a resistor ranging from about 500Ω to about 10 kΩ. In some examples, the VCR 104 is a junction field effect transistor (JFET), such as a p-channel JFET, operating in its linear/ohmic region; however, embodiments of the present disclosure are not limited thereto, and any suitable 3-terminal or 4-terminal active device may be utilized as the VCR, such as a metal-oxide-semiconductor field-effect transistor (MOSFET) or the like.

In some embodiments, the active gain control circuit 100 further includes an operational amplifier (e.g., an error amplifier) 106 that controls the resistance of the VCR 104 by adjusting the gate control signal $V_{GC}$ that is applied to the gate of the JFET. The operational amplifier 106 ensures that the reference voltage (e.g., the PFC/line-in reference voltage) $V_{REF}$ is always within the acceptable range for the input to the PFC controller 70, regardless of the line input voltage $V_{IN}$ (e.g., regardless of whether it is at 120 Vac or 277 Vac). Further, by regulating the reference voltage $V_{REF}$, the operational amplifier 106 ensures that the VCR 104 stays within the linear/ohmic range. In examples in which the VCR 104 is a p-channel JFET (as shown in FIG. 2), the operational amplifier 106 may be biased by a positive bias voltage and ground, which may be derived from the bias windings in the converter 50. However, when the VCR 104 is an n-channel FET, the operational amplifier 106 may be biased by a negative bias voltage, which may also be derived from the bias windings in the converter 50. The biasing of the operational amplifier 106 is omitted from FIG. 2 for ease of illustration.

In some embodiments, the active gain control circuit 100 includes a comparison voltage generator 108 that provides a comparison voltage $V_{COMP}$ (e.g., a constant/fixed voltage for comparison) to a first input terminal (e.g., the positive terminal) of the operational amplifier 106. The comparison voltage $V_{COMP}$ determines the DC-signal level that the reference voltage $V_{REF}$ will be regulated to. The comparison voltage generator 108 may include a zener diode; however, embodiments of the present disclosure are not limited thereto, and the comparison voltage generator 108 may be any suitable reference voltage generator. In some examples, the comparison voltage $V_{COMP}$ may be about 0.5 V to about 6 V (e.g., about 2.4 V). The zener diode shown in FIG. 2 may be biased via a pull-up resistor coupled to a bias voltage supply, which are not shown in FIG. 2 for ease of illustration.

According to some embodiments, the active gain control circuit 100 includes a filter circuit 110 that filters the reference voltage $V_{REF}$ to extract its DC-signal level and provides the filtered reference signal $V_{FREF}$ to the second input terminal (e.g., the negative terminal) of the operational amplifier 106. The filter circuit may include a second resistor $R_2$ electrically coupled between the reference input REF and the second input terminal of the operational amplifier 106, and a first capacitor $C_1$ electrically coupled between the second input terminal of the operational amplifier 106 and the second (e.g., negative) output terminal of the rectifier 40 (i.e., local ground). However, embodiments of the present disclosure are not limited to an RC filter, and any suitable low-pass filter may be utilized in place of the RC filter. Given that the input leakage current of the operational amplifier 106 is very small, the DC-signal level of the filtered reference signal $V_{FM}$ and the reference voltage $V_{REF}$ are the same or substantially the same. Thus, the filter circuit 110 allows the operational amplifier 106 to sample the reference voltage $V_{REF}$.

The difference, or error, between the comparison voltage $V_{COMP}$ and the filtered reference signal $V_{FM}$, coupled with the gain control of the operational amplifier 106 sets the output voltage of the operational amplifier $V_{GC}$, which controls the resistance of the VCR 104. Gain control is achieved via a feedback impedance 112, which may include a third resistor $R_3$ and a second capacitor $C_2$ coupled between the output of the operational amplifier 106 and the second input terminal (e.g., the negative input terminal) of the operational amplifier 106. The gain of the operational amplifier 106 may be determined by the values of the third resistor $R_3$ and the first and second capacitors $C_1$ and $C_2$.

In some embodiments, the active gain control circuit 100 regulates the DC-level of the reference voltage $V_{REF}$ to be substantially the same as the comparison voltage $V_{COMP}$ by appropriately adjusting the resistance of the VCR 104. For example, when the DC-level of the reference voltage $V_{REF}$ is less than the reference voltage $V_{REF}$, the operational amplifier increases the output voltage $V_{GC}$, which causes the resistance of the VCR 104 to also increase, thus raising the DC-level of the reference voltage $V_{REF}$. Similarly, when the DC-level of the reference voltage $V_{REF}$ is greater than the comparison voltage $V_{COMP}$, the operational amplifier decreases the output voltage $V_{GC}$, which causes the resistance of the VCR 104 to also decrease, thus lowering the DC-level of the reference voltage $V_{REF}$. This is done irrespective of the input line voltage $V_{IN}$. Accordingly, when the VCR 104 has sufficient dynamic resistance available, the active gain control circuit 100 can regulate any input line voltage $V_{IN}$, down to an appropriate signal level for the reference input REF at the PFC controller 70.

In some embodiments, the comparison voltage $V_{COMP}$ is set to be within the acceptable range for the input to the PFC controller 70. As such, by regulating the DC level of the reference voltage $V_{REF}$ to be substantially the same as the comparison voltage $V_{COMP}$, the operational amplifier 106 ensures that the voltage $V_{REF}$ is always within the acceptable range for the input to the PFC controller 70, regardless of the line input voltage $V_{IN}$ (e.g., regardless of whether it is at 120 Vac or 277 Vac). Further, in embodiments in which the regulated reference voltage $V_{REF}$ is within the range of drain-source voltage $V_{DS}$ that operates the VCR 104 in the ohmic/linear region, the operational amplifier 106 ensures that the VCR 104 stays within the linear/ohmic range regardless of the line input voltage $V_{IN}$.

In some examples, the first resistor $R_1$ may have a value of about 800 kΩ to about 1.2 MΩ (e.g., about 1 MΩ), the second resistor $R_2$ may have a value of about 400 kΩ to about 600 kΩ (e.g., about 500 kΩ), the third resistor $R_3$ may have a value of about 500 to about 500 kΩ, the first capacitor $C_1$ may have a value of about 1 µF to about 22 µF, and the second capacitor $C_2$ may have a value of about 1 nF to about 1 µF.

Accordingly, by replacing the discrete resistor of the related art with a VCR that is driven by an operational amplifier, the active gain control circuit 100 can exhibit continuously (e.g., infinitely) variable gain values, thus optimizing THD and PF performance irrespective of the input voltage level. The gain level is also controlled by a closed loop feedback network, ensuring the reference voltage level is at a consistent level, this also aids in reducing part-to-part performance variations, which would normally have to be screened for during production.

Figure 3:
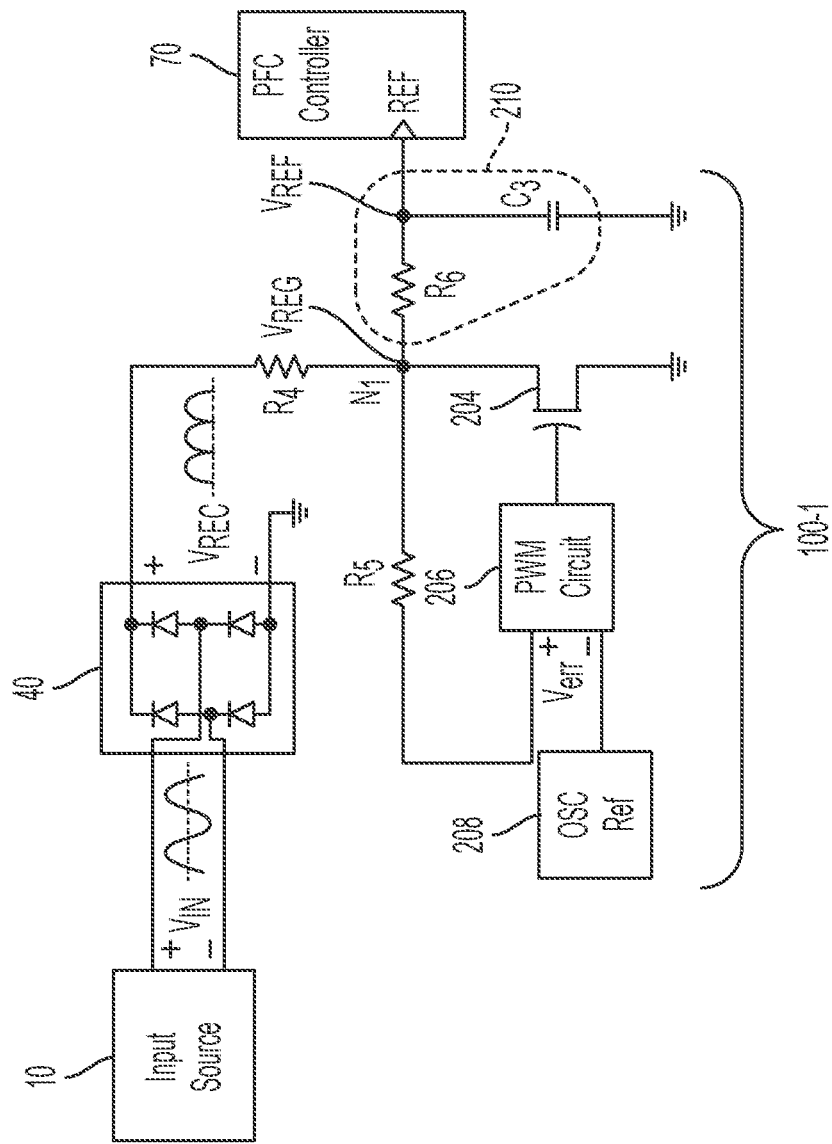
FIG. 3 is a schematic diagram of an active gain control circuit, according to some other embodiments of the present disclosure.

FIG. 3 is a schematic diagram of an active gain control circuit 100-1, according to some other embodiments of the present disclosure.

In some embodiments, the active gain control circuit 100-1 includes a fourth resistor $R_4$ and a switch (e.g., a MOSFET) 204 connected in series between the positive output terminal of the rectifier 40 and the negative output terminal of the rectifier 40 (e.g., the ground). The active gain control circuit 100-1 further includes a pulse-width-modulation (PWM) circuit 206, a reference oscillator 208 and a low-pass filter 210. The PWM circuit 206 regulates a voltage $V_{REG}$ at the node N1 between the fourth resistor $R_4$ and the switch 204 by sampling the voltage $V_{REG}$ through a fifth resistor $R_5$ and comparing the sampled voltage with a reference oscillation signal generated by the reference oscillator 208. The difference, or error, between the sampled voltage and the reference oscillation signal determines the pulse width of a PWM signal generated by the PWM circuit 206, which controls the on-off state of the switch 204. Thus, the PWM circuit regulates the DC-level signal $V_{REG}$ at the node N1. As this voltage has distortions due to the switching effect of the switch 204, the active gain control circuit 100-1 utilizes the low-pass filter 210 to filter out the distortions (e.g., high-frequency components) of the voltage $V_{REG}$ and produce a reference signal $V_{REF}$ that is an attenuated version of the rectifier signal $V_{REC}$. The low-pass filter may be an RC filter including a sixth resistor $R_6$ and a third capacitor $C_3$.

While the active gain control circuits 100 and 100-1 of FIGS. 2 and 3 achieve the same goal, the active gain control circuit 100 of FIG. 2 is a simpler and less costly circuit to fabricate.

Accordingly, as described above, the active gain control circuit 100/100-1 according to some embodiments, allows high power-factor and low total harmonic distortion across a wide-range of input line voltages for LED drivers and power supplies, with reduced (e.g., minimal) circuitry. Further, the use of such active gain control circuit 100/100-1 in conjunction with the PFC controller 70, eliminates the constant back-and-forth fine tuning a product typically goes through when preparing the product for production. Further, in the related art, the reference signal level resistors have to be adjusted as the LED driver sample size increases, to account for outliers and to ensure a manufacturable product. However, the active gain control circuit according to some embodiments of the present disclosure has a closed-loop, ensuring consistent part-to-part performance.

Furthermore, the active gain control circuit 100/100-1 according to some embodiments, simplifies derivative product design. Once the initial main design is complete, derivatives are easy to design, as there is no need to adjust reference signal levels at multiple input voltages. It is sufficient to adjust one time at one input voltage (e.g., to ensure that the JFET VCR is operating in the appropriate ohmic region), and the circuit handles the rest.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept". Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the terms "substantially", "about", and similar terms are used as terms of approximation and not as terms of degree, and are intended to account for the inherent variations in measured or calculated values that would be recognized by those of ordinary skill in the art.

As used herein, the terms "use", "using", and "used" may be considered synonymous with the terms "utilize", "utilizing", and "utilized", respectively.

The power supply system and/or any other relevant devices or components according to embodiments of the present disclosure described herein may be implemented by utilizing any suitable hardware, firmware (e.g., an application-specific integrated circuit), software, or a suitable combination of software, firmware, and hardware. For example, the various components of the independent multi-source display device may be formed on one integrated circuit (IC) chip or on separate IC chips. Further, the various components of the power supply system may be implemented on a flexible printed circuit film, a tape carrier package (TCP), a printed circuit board (PCB), or formed on the same substrate. Further, the various components of the power supply system, such as the PFC controller, may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer-readable media. Also, a person of skill in the art should recognize that the functionality of various computing devices may be combined or integrated into a single computing device, or the functionality of a particular computing device may be distributed across one or more other computing devices without departing from the scope of the exemplary embodiments of the present disclosure.

While this disclosure has been described in detail with particular references to illustrative embodiments thereof, the embodiments described herein are not intended to be exhaustive or to limit the scope of the disclosure to the exact forms disclosed. Persons skilled in the art and technology to which this disclosure pertains will appreciate that alterations and changes in the described structures and methods of assembly and operation can be practiced without meaningfully departing from the principles, spirit, and scope of this disclosure, as set forth in the following claims and equivalents thereof.

What is claimed is:

1. An active gain control circuit comprising:
    a voltage divider having a variable resistance configured to attenuate a rectified input line voltage to produce a reference signal;
    a filter circuit configured to extract a DC-level reference voltage from the reference signal;
    an operational amplifier configured to receive the DC-level reference voltage and a comparison voltage, and to generate a gate control signal based on a difference between the comparison voltage and the DC-level reference voltage; and
    a feedback impedance electrically coupled between an output and a second input terminal of the operational amplifier, and configured to control a gain of the operational amplifier,
    wherein a resistance of the voltage divider is controlled by the gate control signal.

2. The active gain control circuit of claim 1, wherein the voltage divider comprises:
    a first resistor configured to receive the rectified input line voltage; and
    a voltage-controlled resistor (VCR) electrically coupled to the first resistor and the operational amplifier, a resistance of the VCR being determined by the gate control signal.

3. The active gain control circuit of claim 2, wherein the first resistor has a resistance of 800 kΩ to 1.2 MΩ, and
    wherein the resistance of the VCR varies from 500Ω to 10 kΩ depending on the gate control signal.

4. The active gain control circuit of claim 2, wherein the first resistor is electrically coupled between a positive output terminal of a rectifier and a reference input, and
    wherein the VCR is electrically coupled between the reference input and a negative output terminal of the rectifier.

5. The active gain control circuit of claim 4, wherein the operational amplifier is configured to adjust the resistance of the VCR to regulate a reference voltage of the reference input to the comparison voltage.

6. The active gain control circuit of claim 2, wherein the VCR comprises:
    a junction field effect transistor (JFET) having a gate electrically coupled to the output of the operational amplifier.

7. The active gain control circuit of claim 6, wherein the operational amplifier is configured to maintain the JFET in an ohmic region of operation irrespective of the rectified input line voltage.

8. The active gain control circuit of claim 2, wherein the resistance of the VCR is configured to increase as a voltage of the gate control signal increases, and to decrease as the voltage of the gate control signal decreases.

9. The active gain control circuit of claim 1, further comprising:
    a comparison voltage generator electrically coupled to a first input terminal of the operational amplifier and configured to generate the comparison voltage.

10. The active gain control circuit of claim 9, wherein the comparison voltage generator comprises a zener diode, and wherein the comparison voltage is 0.5 V to 6 V.

11. The active gain control circuit of claim 1, wherein the filter circuit comprises:
    a second resistor electrically coupled between a reference input and the second input terminal of the operational amplifier; and
    a first capacitor electrically coupled between the second input terminal and the second output terminal of a rectifier.

12. The active gain control circuit of claim 11, wherein the second resistor has a resistance of 400 kΩ to 600 kΩ, and wherein the first capacitor has a capacitance value of 1 μF to 22 μF.

13. The active gain control circuit of claim 1, wherein the feedback impedance comprises:
a third resistor; and
a second capacitor coupled in series with the third resistor.

14. The active gain control circuit of claim 13, wherein the third resistor has a resistance of 500Ω to 500 kΩ, and wherein the second capacitor has a capacitance value of 1 nF to 1 μF.

15. A power supply system comprising:
a power factor correction (PFC) controller configured to reduce a total harmonic distortion and increase a power factor of the power supply system, the PFC controller having a reference input; and
an active gain control circuit configured to regulate a voltage at the reference input, and comprising:
a voltage divider having a variable resistance configured to attenuate a rectified input line voltage to produce a reference signal;
a filter circuit configured to extract a DC-level reference voltage from the reference signal;
an operational amplifier configured to receive the DC-level reference voltage and a comparison voltage, and to generate a gate control signal based on a difference between the comparison voltage and the DC-level reference voltage; and
a feedback impedance electrically coupled between an output and a second input terminal of the operational amplifier, and configured to control a gain of the operational amplifier,
wherein a resistance of the voltage divider is controlled by the gate control signal.

16. The power supply system of claim 15, further comprising:
a rectifier configured to rectify an input line voltage to generate the rectified input line voltage; and
a converter configured to convert the rectified input line voltage into a drive signal for powering a light source.

17. The power supply system of claim 16, wherein the PFC controller is configured to determine a shape of an input current waveform of the converter based on the voltage at the reference input.

18. The power supply system of claim 16, wherein the input line voltage is from 100 Vac to 277 Vac.

19. The power supply system of claim 15, wherein the voltage divider comprises a voltage-controlled resistor (VCR) configured to receive the gate control signal, and
wherein the operational amplifier is configured to regulate the voltage at the reference input by increasing a resistance of the VCR in response to the voltage at the reference input being less than the comparison voltage, and decreasing the resistance of the VCR in response to the voltage at the reference input being greater than the comparison voltage.

* * * * *